US006632715B2

United States Patent
Koishikawa

(10) Patent No.: US 6,632,715 B2
(45) Date of Patent: Oct. 14, 2003

(54) SEMICONDUCTOR DEVICE HAVING NONVOLATILE MEMORY CELL AND FIELD EFFECT TRANSISTOR

(75) Inventor: Yukimasa Koishikawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/112,715

(22) Filed: Apr. 2, 2002

(65) Prior Publication Data
US 2002/0117710 A1 Aug. 29, 2002

Related U.S. Application Data

(62) Division of application No. 09/605,738, filed on Jun. 29, 2000, now Pat. No. 6,429,480.

(30) Foreign Application Priority Data

Jun. 29, 1999 (JP) .......................................... 11-182809

(51) Int. Cl.⁷ ............................................ H01L 21/336
(52) U.S. Cl. ...................................... 438/258; 438/592
(58) Field of Search ........................ 438/182, 257–267, 438/736, 738, 592; 257/314–326

(56) References Cited

U.S. PATENT DOCUMENTS

| 5,612,238 A | * 3/1997 | Sato et al. .................. 438/3 |
| 5,648,672 A | 7/1997 | Hasegawa et al. |
| 5,840,619 A | 11/1998 | Hayashide et al. |
| 6,228,712 B1 | 5/2001 | Kawai et al. |

FOREIGN PATENT DOCUMENTS

| JP | 64-64251 | 3/1989 |
| JP | A 7-287994 | 10/1995 |
| JP | A 8-107158 | 4/1996 |
| JP | 2626523 | 4/1997 |
| JP | 9-102554 | 4/1997 |
| JP | 10-107230 | 4/1998 |
| JP | 11-26728 | 1/1999 |
| JP | A 11-154714 | 6/1999 |
| JP | A 2000-216363 | 8/2000 |

* cited by examiner

Primary Examiner—Wael Fahmy
Assistant Examiner—Marcos D. Pizarro-Crespo
(74) Attorney, Agent, or Firm—Young & Thompson

(57) ABSTRACT

A semiconductor device in which a nonvolatile memory cell with a floating gate electrode and a field effect transistor are formed on a semiconductor substrate includes a first conductive layer, a first interlevel insulating film, a second conductive layer, and a control gate electrode of the nonvolatile memory cell. The first conductive layer is formed on the semiconductor substrate via a tunnel insulating film, and patterned into a predetermined shape. The first interlevel insulating film is formed on the semiconductor substrate so as to cover the field effect transistor, and has a first opening for exposing the surface of the first conductive layer. The second conductive layer is formed on the first conductive layer inside the first opening, and patterned into a predetermined shape. The control gate electrode of the nonvolatile memory cell is formed on the second conductive layer via an internal insulating film patterned into a predetermined shape. The first and second conductive layers constitute the floating gate electrode, and the first conductive layer has a planar shape which can be patterned at the same time as the gate electrode of the field effect transistor. A method of manufacturing the semiconductor device is also disclosed.

12 Claims, 9 Drawing Sheets

SEMICONDUCTOR DEVICE HAVING NONVOLATILE MEMORY CELL AND FIELD EFFECT TRANSISTOR

This application is a division of application Ser. No. 09/605,738 filed on Jun. 29, 2000, now U.S. Pat. No. 6,429,480.

BACKGROUND OF THE INVENTION

1. Field of the Invention

The present invention relates to a semiconductor device and a method of manufacturing the same and, more particularly, to a semiconductor device having a MOS (Metal-Oxide-Semiconductor) nonvolatile memory cell with a floating gate electrode, and a MOS field effect transistor (to be referred to as a MOS transistor hereinafter), and a method of manufacturing the same.

2. Description of the Prior Art

In general, a semiconductor device incorporating a nonvolatile memory and a logic circuit (e.g., circuit having a nonvolatile memory control function) on one chip comprises, on a semiconductor substrate, a MOS nonvolatile memory cell (to be simply referred to as a memory cell hereinafter) with a multilayered gate structure of floating and control gate electrodes, and a MOS transistor operating as a logic circuit element.

FIGS. 1A to 1F show an example of a method of manufacturing a conventional semiconductor device having a nonvolatile memory cell and a MOS transistor.

As shown in FIG. 1A, silicon oxide element isolation regions 102 are formed in the surface region of a silicon substrate 101. The element isolation regions 102 demarcate many active regions in the surface region of the silicon substrate 101 in both a memory cell region A101 where memory cells are going to be formed and a logic circuit region A102 where MOS transistors are going to be formed. For descriptive convenience, single active regions are formed in the memory cell and logic circuit regions A101 and A102, respectively.

A silicon oxide film (not shown) is formed on the entire surface of the silicon substrate 101, and a doped polysilicon film (not shown) is deposited on the silicon oxide film. The silicon oxide film and the polysilicon film are simultaneously patterned into a predetermined shape to form a tunnel insulating film 103 and a floating gate electrode 104 in the memory cell region A101 on the silicon substrate 101.

As shown in FIG. 1B, a silicon oxide film and a doped polysilicon film (neither is shown) are sequentially deposited to cover the entire silicon substrate 101, and patterned into the same shape as the floating gate electrode 104, thereby forming an internal insulating film 105 and a control gate electrode 106 on the floating gate electrode 104. At this time, a deposited silicon oxide film 107 and a polysilicon film 108 remain in the logic circuit region A102 on the silicon substrate 101.

As shown in FIG. 1C, the silicon oxide film 107 and the polysilicon film 108 are simultaneously patterned into a predetermined shape to form a gate insulating film 109 and a gate electrode 110 in the logic circuit region A102.

As shown in FIG. 1D, a silicon oxide film (not shown) is deposited to cover the entire silicon substrate 101, and then etched back to form a pair of silicon oxide sidewall spacers 112A on the sides of the floating and control gate electrodes 104 and 106, and a pair of silicon oxide sidewall spacers 112B on the sides of the gate electrode 110.

Subsequently, impurity ions are implanted into the surface region of the silicon substrate 101 using the control gate electrode 106, gate electrode 110, and sidewall spacers 112A and 112B as a mask. This ion implantation forms a pair of source and drain regions 111A in the memory cell region A101, and a pair of source and drain regions 111B in the logic circuit region A102.

As a result, a MOS memory cell 121 made up of the pair of source and drain regions 111A, tunnel insulating film 103, floating gate electrode 104, internal insulating film 105, and control gate electrode 106 is formed in the memory cell region A101. A MOS transistor 122 made up of the pair of source and drain regions 111B, gate insulating film 109, and gate electrode 110 is formed in the logic circuit region A102.

As shown in FIG. 1E, silicon oxide is deposited to cover the entire silicon substrate 101, thereby forming an interlevel insulating film 113. Then, the surface of the interlevel insulating film 113 is planarized. The interlevel insulating film 113 is selectively etched using a patterned photoresist film as a mask, thereby forming contact holes 114 and 115 extending through the interlevel insulating film 113. The bottoms of the contact holes 114 and 115 reach the control gate electrode 106 and one source/drain region 111B, respectively.

As shown in FIG. 1F, a tungsten film (not shown) is deposited on the interlevel insulating film 113 to a thickness enough to completely fill the internal spaces of the contact holes 114 and 115. This tungsten film is patterned into a predetermined shape, thereby forming interconnection layers 116 and 117.

In this manner, a conventional semiconductor device in which the memory cell 121 and the MOS transistor 122 are formed on the silicon substrate 101 is completed.

In the conventional semiconductor device manufacturing method shown in FIGS. 1A to 1F, the control gate electrode 106 of the memory cell 121 and the gate electrode 110 of the MOS transistor 122 are formed by patterning identical polysilicon films. However, patterning the polysilicon film is separately performed for the control gate electrode 106 and the gate electrode 110. The polysilicon films cannot be patterned at once because the memory cell 121 and the MOS transistor 122 are different in design rule. That is, the MOS transistor 122 has a finer structure than the memory cell 121. Since the memory cell 121 has the multilayered gate structure of the floating and control gate electrodes 104 and 106, the gate electrode 110 cannot be formed prior to formation of the floating gate electrode 104. For this reason, the manufacturing process concerning formation of the MOS transistor 122 must be greatly changed, which makes it difficult to share the manufacturing process and the manufacturing equipment. Hence, the manufacturing cost increases.

When the memory cell 121 is micropatterned for high integration degree, the planar shapes of the control and floating gate electrodes 106 and 104 are downsized. Accordingly, the overlapping area between the control and floating gate electrodes 106 and 104 decreases to decrease the electrostatic capacitance. A small electrostatic capacitance between the control and floating gate electrodes 106 and 104 decreases the capacitive coupling ratio (ratio of the electrostatic capacitance between the control and floating gate electrodes 106 and 104 to that between the floating gate electrode 104 and the silicon substrate 101). This makes it difficult to transfer a voltage applied to the control gate electrode 106 to a channel region formed between the pair of source and drain regions 111A. This increases the driving voltage.

SUMMARY OF THE INVENTION

The present invention has been made in consideration of the above situation, and has as its first object to provide a semiconductor device in which the manufacturing process and the manufacturing equipment can be easily shared to reduce the manufacturing cost, and a method of manufacturing the same.

It is the second object of the present invention to provide a semiconductor device capable of forming a nonvolatile memory cell without greatly changing the manufacturing process concerning a field effect transistor, and a method of manufacturing the same.

It is the third object of the present invention to provide a semiconductor device capable of incorporating a nonvolatile memory cell that can be driven by a low voltage, and a method of manufacturing the same.

To achieve the first and second objects, according to the first aspect of the present invention, there is provided a semiconductor device in which a nonvolatile memory cell with a floating gate electrode and a field effect transistor are formed on a semiconductor substrate, comprising a first conductive layer which is formed on the semiconductor substrate via a tunnel insulating film, and patterned into a predetermined shape, a first interlevel insulating film which is formed on the semiconductor substrate so as to cover the field effect transistor, and has a first opening for exposing a surface of the first conductive layer, a second conductive layer which is formed on the first conductive layer inside the first opening, and patterned into a predetermined shape, and a control gate electrode of the nonvolatile memory cell which is formed on the second conductive layer via an internal insulating film patterned into a predetermined shape, wherein the first and second conductive layers constitute the floating gate electrode, and the first conductive layer has a planar shape which can be formed at the same time as a gate electrode of the field effect transistor.

In the semiconductor device according to the first aspect, the floating gate electrode of the nonvolatile memory cell is constituted by the first conductive layer formed on the semiconductor substrate via the tunnel insulating film, and the second conductive layer formed on the first conductive layer inside the first opening of the first interlevel insulating film. The first conductive layer has a planar shape which can be formed at the same time as the gate electrode of the field effect transistor.

For this reason, the first conductive layer and the gate electrode of the field effect transistor can be simultaneously formed. In addition, the second conductive layer, internal insulating film, and control gate electrode unique to the nonvolatile memory cell can be formed after the first interlevel insulating film covers the field effect transistor. Therefore, the manufacturing process concerning formation of the field effect transistor need hardly be changed. The manufacturing process and the manufacturing equipment can be easily shared, and sharing realizes low manufacturing cost.

Since the second conductive layer is formed inside the first opening, the planar shape of the second conductive layer can be widened without changing the occupied area of the nonvolatile memory cell. By widening the planar shape of the second conductive layer, the overlapping area between the floating and control gate electrodes increases to increase the electrostatic capacitance between the floating and control gate electrodes. Thus, the capacitive coupling ratio increases to realize driving by low voltage.

To form the first conductive layer at the same time as the gate electrode of the field effect transistor, the first conductive layer suffices to have a planar shape which can be patterned at the same time as the gate electrode of the field effect transistor. For example, the width of the planar shape of the first conductive layer is set almost equal to the gate length of the field effect transistor.

According to the second preferable aspect of the semiconductor device of the present invention, the planar shape of the first conductive layer is substantially the same as a planar shape of the gate electrode. This facilitates simultaneous formation of the first conductive layer and the gate electrode of the field effect transistor.

According to the third preferable aspect of the semiconductor device of the present invention, the semiconductor device further comprises an interconnection layer electrically connected to a source/drain region of the field effect transistor via a contact hole formed in the first interlevel insulating film, and the control gate electrode is made of the same material as the interconnection layer. Since the control gate electrode and the interconnection layer can be simultaneously formed, the manufacturing process can be simplified to reduce the manufacturing cost.

According to the fourth preferable aspect of the semiconductor device of the present invention, the semiconductor device further comprises a second interlevel insulating film which has a trench communicating with the contact hole and is formed on the first interlevel insulating film, the second interlevel insulating film has a second opening for exposing the internal insulating film, the control gate electrode is buried in the second opening, and the interconnection layer is buried in the trench. In this case, the interconnection layer is formed as a so-called buried interconnection, which is advantageous to high integration degree and high density.

According to the fifth preferable aspect of the present invention, the second conductive layer extends onto the second interlevel insulating film outside the first opening together with the internal insulating film. In this case, the electrostatic capacitance between the floating and control gate electrodes can be further increased.

According to the sixth preferable aspect of the present invention, the internal insulating film and the second conductive layer are patterned into substantially the same shape. Since the second conductive layer and the internal insulating film can be simultaneously patterned, the manufacturing process can be further simplified to reduce the manufacturing cost.

To achieve the third object, according to the seventh aspect of the present invention, there is provided a method of manufacturing a semiconductor device in which a nonvolatile memory cell with a floating gate electrode and a field effect transistor are formed on a semiconductor substrate, comprising the first step of forming the field effect transistor, and a first conductive layer patterned into a predetermined shape via a tunnel insulating film on the semiconductor substrate, the second step of forming a first interlevel insulating film on the semiconductor substrate so as to cover the first conductive layer and the field effect transistor, the third step of selectively etching the first interlevel insulating film to form a first opening for exposing a surface of the first conductive layer, the fourth step of forming a structure made up of a second conductive layer which is formed on the first conductive layer inside the first opening and patterned into a predetermined shape, and an internal insulating film which is formed on the second conductive layer and patterned into a predetermined shape, and the fifth step of forming a control gate electrode of the nonvolatile memory cell on the internal insulating film, wherein the first and second conductive layers constitute the floating gate electrode, and the first conductive layer has a planar shape which can be formed at the same time as a gate electrode of the field effect transistor.

According to the semiconductor device manufacturing method of the present invention, the manufacturing process and the manufacturing equipment can be easily shared for substantially the same reason as described in the semiconductor device of the present invention. Sharing can reduce the manufacturing cost. Moreover, driving by low voltage is realized.

According to the eighth preferable aspect of the semiconductor device manufacturing method of the present invention, the planar shape of the first conductive layer is substantially the same as a planar shape of the gate electrode. This enables simultaneously forming the first conductive layer and the gate electrode of the field effect transistor.

According to the ninth preferable aspect of the semiconductor device manufacturing method of the present invention, the fifth step comprises forming, at the same time as the control gate electrode, an interconnection layer electrically connected to a source/drain region of the field effect transistor via a contact hole formed in the first interlevel insulating film. The manufacturing process can be simplified to reduce the manufacturing cost.

According to the 10th preferable aspect of the semiconductor device manufacturing method of the present invention, the method further comprises the sixth step of forming on the first interlevel insulating film a second interlevel insulating film having a second opening for exposing the internal insulating film and a trench communicating with the contact hole, and the fifth step comprises burying the control gate electrode in the second opening and burying the interconnection layer in the trench. The interconnection layer is formed as a so-called buried interconnection, which is advantageous to high integration degree and high density.

According to the 11th preferable aspect of the semiconductor device manufacturing method of the present invention, the second conductive layer extends onto the second interlevel insulating film outside the first opening together with the internal insulating film. This can further increase the electrostatic capacitance between the floating and control gate electrodes.

According to the 12th preferable aspect of the semiconductor device manufacturing method of the present invention, the internal insulating film and the second conductive layer are patterned into substantially the same shape. Since the second conductive layer and the internal insulating film can be simultaneously patterned, the manufacturing process can be further simplified to reduce the manufacturing cost.

The semiconductor device and manufacturing method of the present invention in the above aspects are preferably applied to a semiconductor device in which a field effect transistor is formed in a logic circuit region on a semiconductor substrate.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF PREFERRED EMBODIMENTS

Several preferred embodiments of the present invention will be described in detail below with reference to the accompanying drawings.

First Embodiment

FIGS. 2A to 2K, FIG. 3, and FIG. 4 show the steps in manufacturing a semiconductor device according to the first embodiment of the present invention.

The semiconductor device according to the first embodiment of the present invention is manufactured by the following method.

Figure 1A:
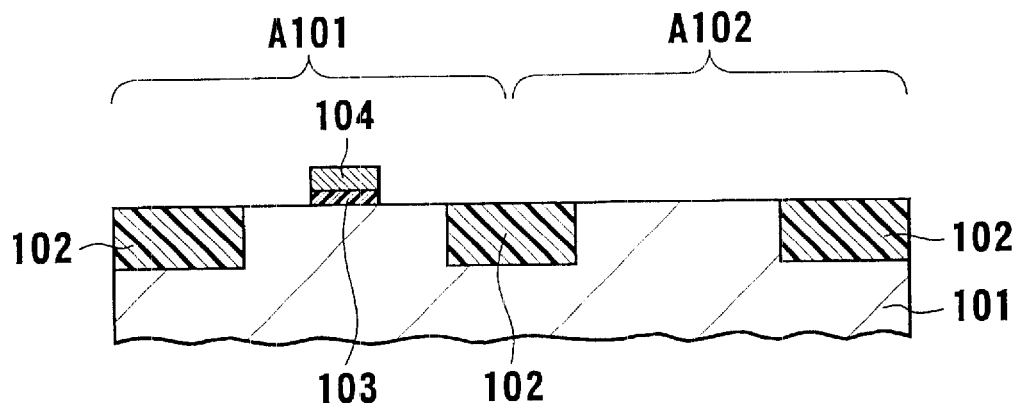
FIGS. 1A to 1F are schematic sectional views, respectively, showing the principal steps in manufacturing a conventional semiconductor device.
Figure 1B:
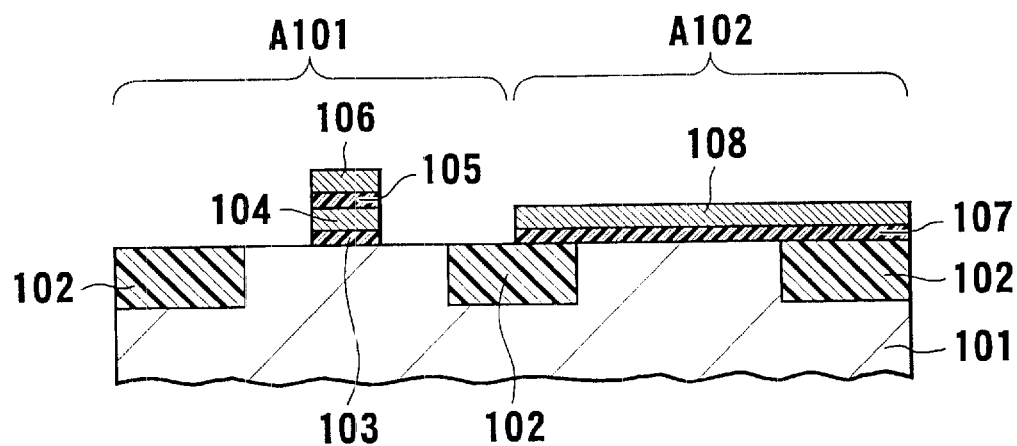
Figure 1C:
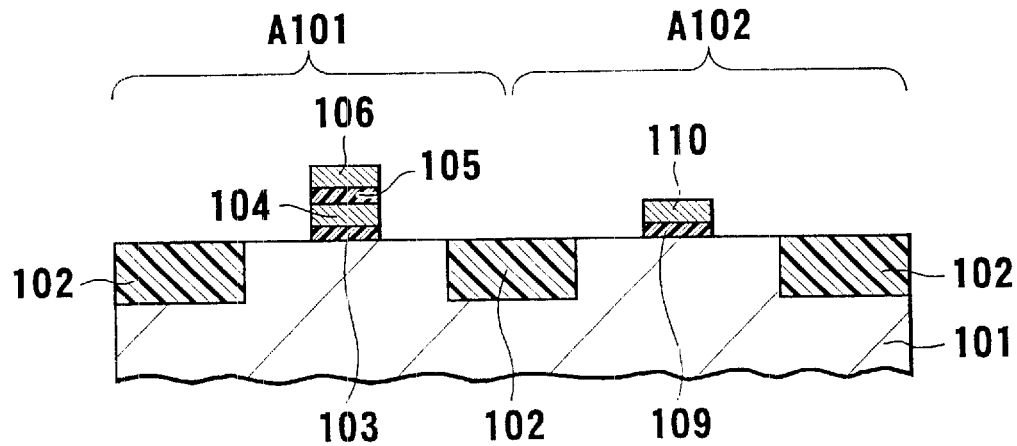
Figure 1D:
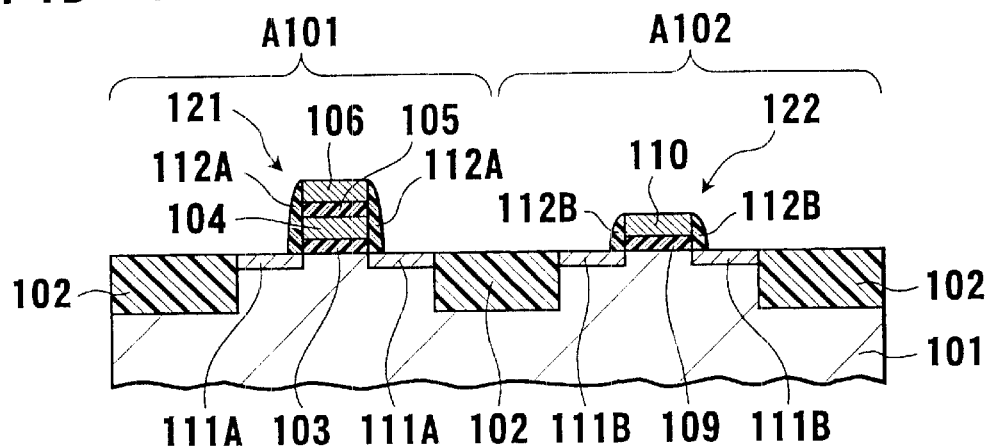
Figure 1E:
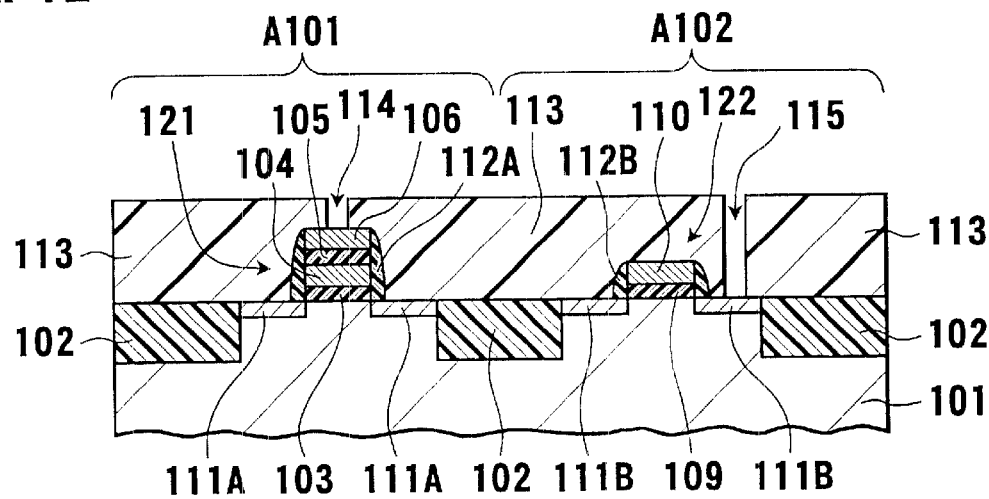
Figure 1F:
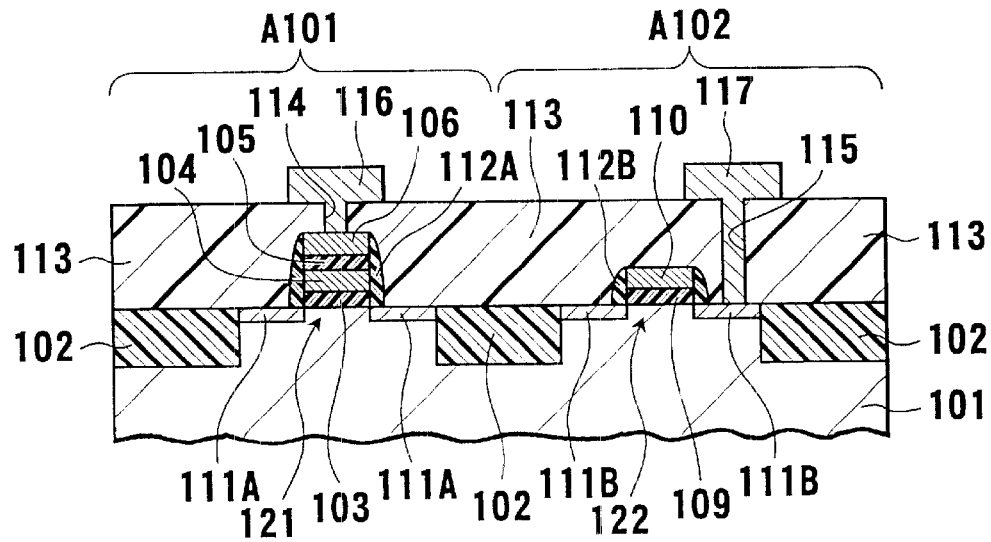
Figure 2A:
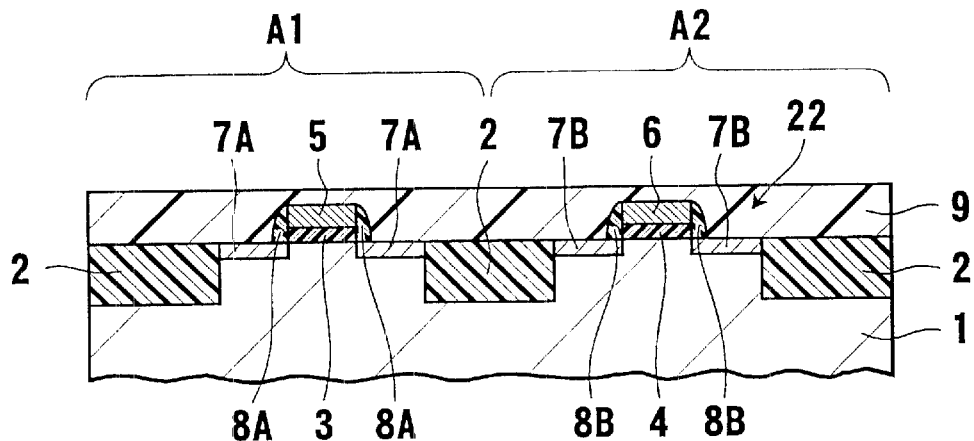
FIGS. 2A to 2K are schematic sectional views, respectively, showing the principal steps in manufacturing a semiconductor device according to the first embodiment of the present invention.
Figure 3:
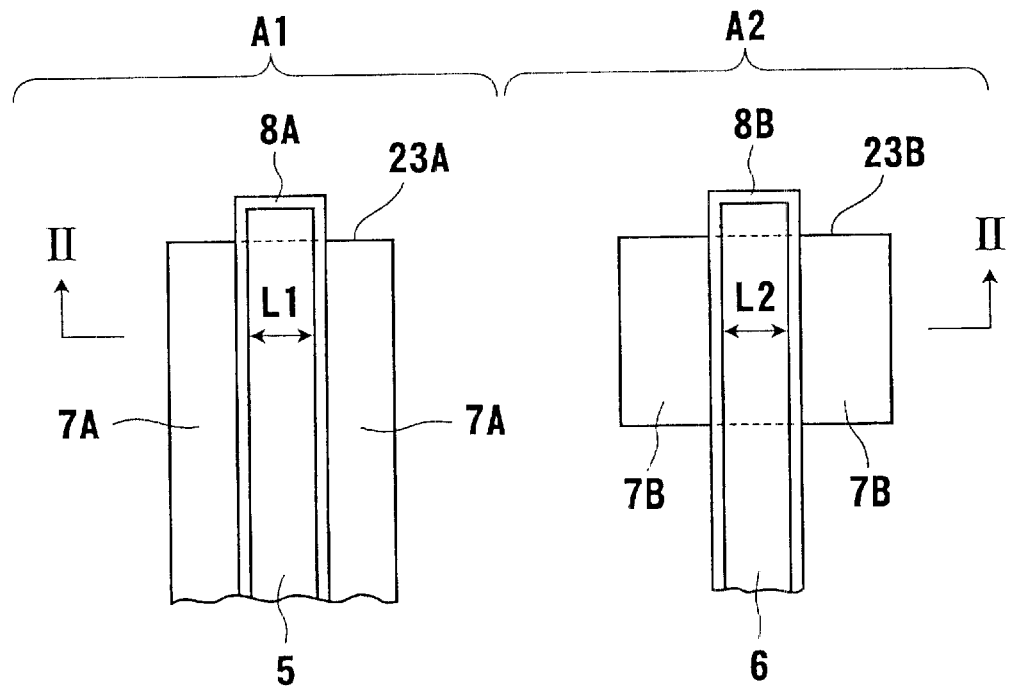
FIG. 3 is a schematic plan view in one principal step in manufacturing a semiconductor device according to the first embodiment of the present invention, and corresponds to a state in FIG. 2A.

As shown in FIGS. 2A and 3, silicon oxide element isolation regions 2 are formed in the surface region of a silicon substrate 1 by a known method. The element isolation regions 2 demarcate many active regions in the surface region of the silicon substrate 1 in both a memory cell region A1 where memory cells are going to be formed and a logic circuit region A2 where MOS transistors are going to be formed. For descriptive convenience, single active regions 23A and 23B are formed in the memory cell and logic circuit regions A1 and A2, respectively. This also applies to the following description.

A silicon oxide film (not shown) is formed on the entire surface of the silicon substrate 1, and a doped polysilicon film (not shown) is deposited on the silicon oxide film by CVD (Chemical Vapor Deposition). The silicon oxide film and the polysilicon film are patterned to form a silicon oxide tunnel insulating film 3 and a first polysilicon conductive layer 5 in the memory cell region A1 on the silicon substrate 1, and form a silicon oxide gate insulating film 4 and a polysilicon gate electrode 6 in the logic circuit region A2 on the silicon substrate 1.

As shown in FIG. 3, a width L1 of the first conductive layer 5 is set equal to a gate length L2 of the gate electrode 6. The first conductive layer 5 has a planar shape which can be patterned at the same time as the gate electrode 6. The planar shape of the first conductive layer 5 is preferably set almost the same as that of the gate electrode 6.

A silicon oxide film (not shown) is deposited by CVD so as to cover the entire silicon substrate 1, and etched back by anisotropic RIE (Reactive Ion Etching), thereby forming pairs of silicon oxide sidewall spacers 8A and 8B on the sides of the first conductive layer 5 and gate electrode 6, respectively.

Impurity ions are implanted using the first conductive layer 5, gate electrode 6, and sidewall spacers 8A and 8B as a mask, thereby forming in self alignment a pair of source and-drain regions 7A in the surface region of the silicon substrate 1 in the memory cell region A1, and a pair of source and drain regions 7B in the surface region of the silicon substrate 1 in the logic circuit region A2.

As a result, a MOS transistor 22 made up of the gate insulating film 4, gate electrode 6, pair of sidewall spacers 8B, and pair of source and drain regions 7B is formed in the logic circuit region A2.

Then, a first interlevel insulating film 9 is formed to cover the entire silicon substrate 1, and planarized by CMP (Chemical Mechanical Polishing). As the first interlevel insulating film 9, a silicon oxide film deposited by CVD can be used. The first interlevel insulating film 9 is 1 to 4 Å thick, and completely covers the first conductive layer 5 and the gate electrode 6.

Figure 2B:
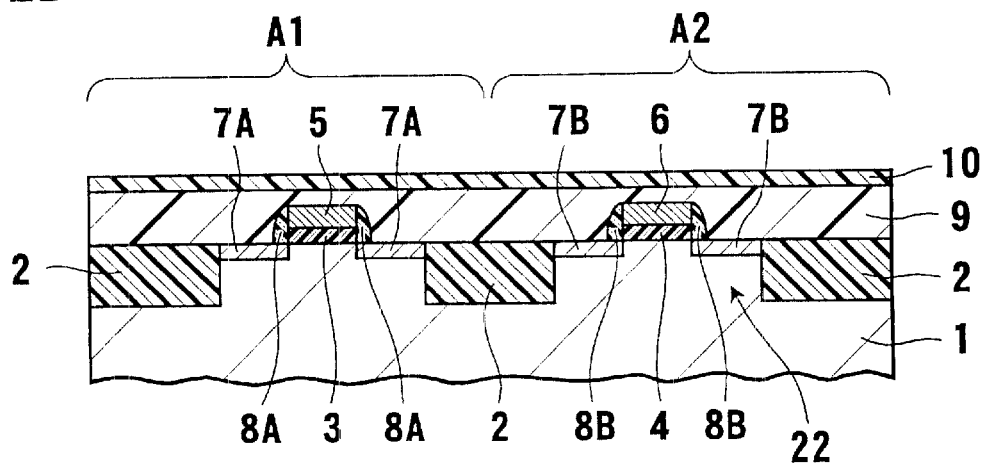

As shown in FIG. 2B, a silicon nitride film 10 functioning as an etching stopper film is deposited on the first interlevel insulating film 9 by CVD. This silicon nitride film 10 is 50 to 200 Å thick.

Note that another film other than the silicon nitride film can be used as the etching stopper film as far as the etching stopper film is made of a material having a different etching rate from that of a second interlevel insulating film (to be described below).

Figure 2C:
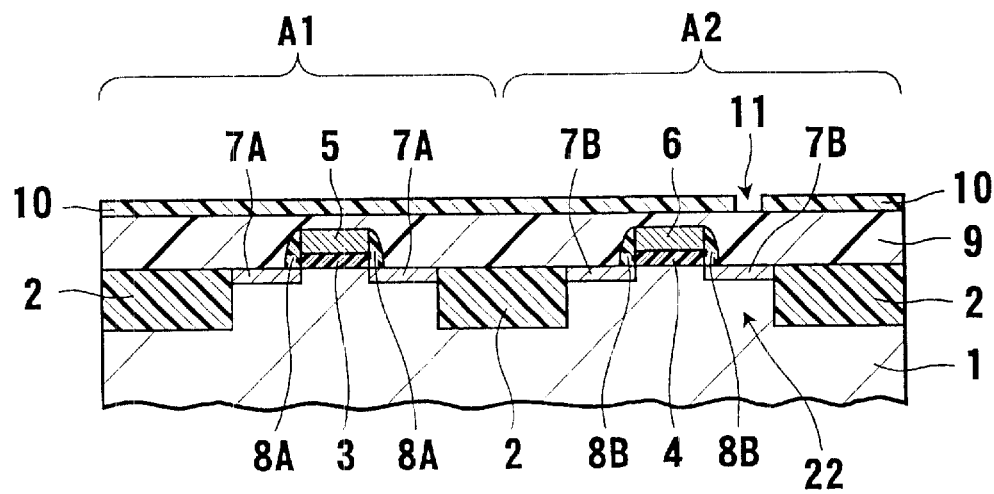

As shown in FIG. 2C, a patterned photoresist film (not shown) is formed on the silicon nitride film 10. The silicon nitride film 10 is selectively etched using the photoresist film as a mask, thereby forming a through hole 11. Thereafter, the photoresist film is removed. This through hole 11 is positioned immediately above one of the pair of source and drain regions 7B, and has, e.g., a rectangular sectional shape.

Figure 2D:
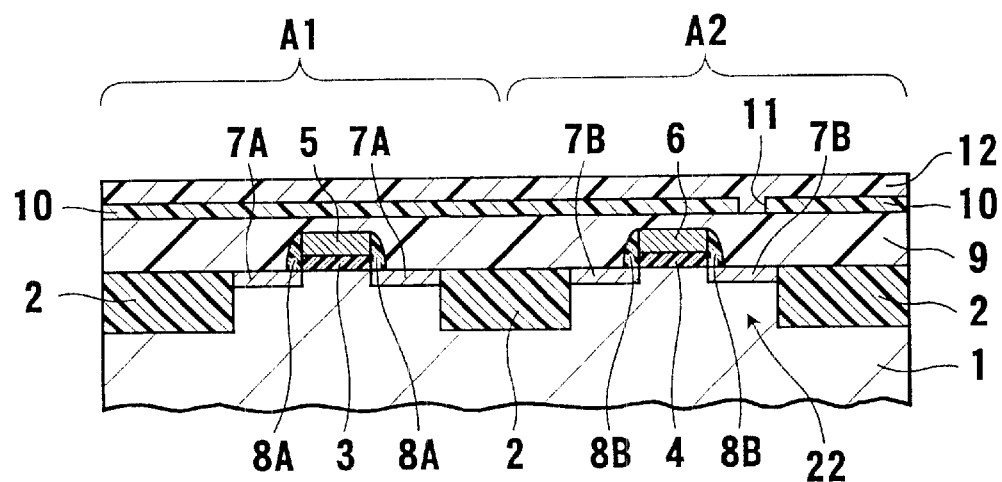

As shown in FIG. 2D, a second interlevel insulating film 12 is formed on the silicon nitride film 10, and then planarized by CMP. As the second interlevel insulating film 12, a BPSG (BoroPhosphoSilicate Glass) film deposited by CVD can be used. The second interlevel insulating film 12 is 3,000 to 8,000 Å thick.

Figure 2E:
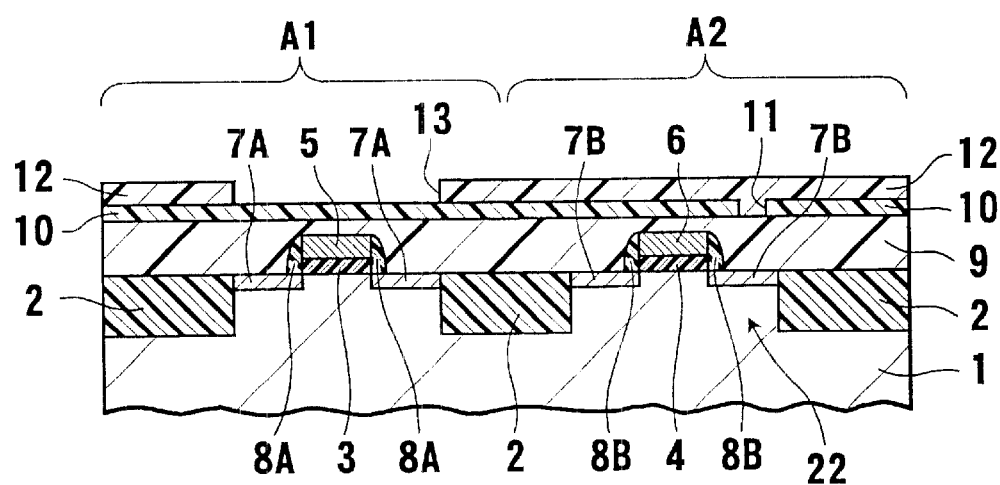

As shown in FIG. 2E, a patterned photoresist film (not shown) is formed on the second interlevel insulating film 12. Only the second interlevel insulating film 12 is selectively etched using the photoresist film as a mask, thereby forming a through hole 13. The through hole 13 is positioned immediately above the first conductive layer 5, and has an almost rectangular sectional shape.

In this etching step, etching conditions are set such that the etching rate of the second interlevel insulating film 12 is much higher than that of the silicon nitride film 10 (i.e., selectivity is much higher) so as to make the silicon nitride film 10 function as an etching stopper.

Figure 2F:
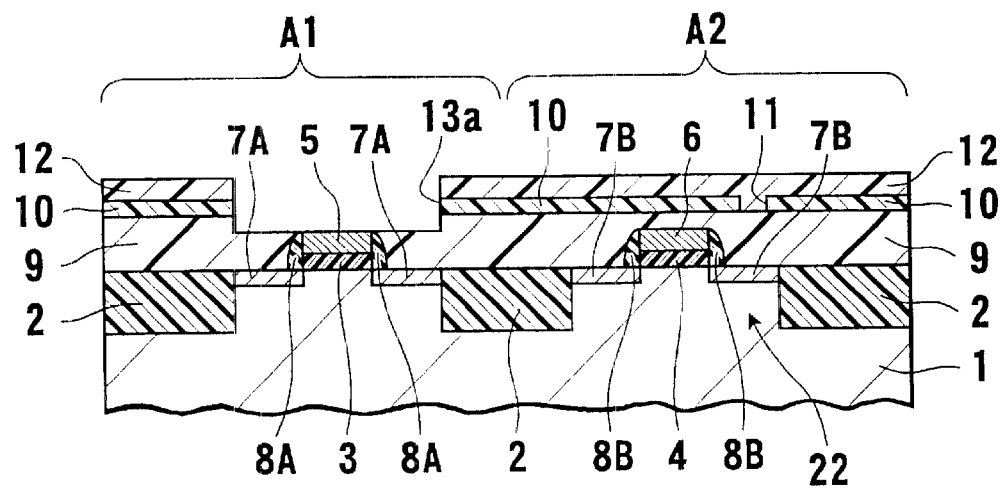

As shown in FIG. 2F, the silicon nitride film 10 is selectively etched using as a mask the same photoresist film on the second interlevel insulating film 12. Further, the first interlevel insulating film 9 is selectively etched to remove the photoresist film. In this way, an opening 13a extending through the second interlevel insulating film 12 and silicon nitride film 10 to the middle of the first interlevel insulating film 9 is formed. The surface of the first conductive layer 5 is exposed from the opening 13a.

In this etching step, etching conditions are set such that the surface of the first conductive layer 5 is reliably exposed from the opening 13a. As the etching solution, a hydrofluoric acid-based solution is used.

In forming the opening 13a in the above-described way, only the second interlevel insulating film 12 is etched, and then the silicon nitride film 10 and the first interlevel insulating film 9 are etched. This increases controllability in etching of the first interlevel insulating film 9, and optimizes the etching amount of the first interlevel insulating film 9.

Figure 2G:
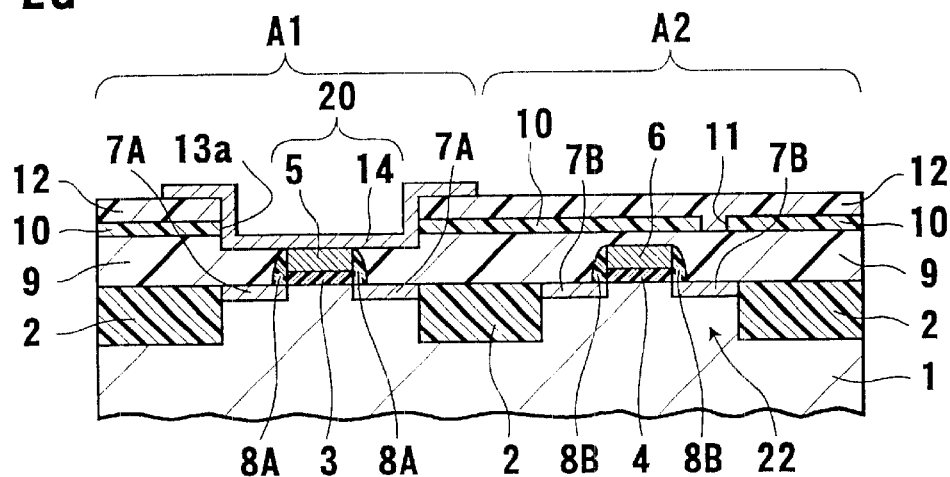

As shown in FIG. 2G, a doped polysilicon film (not shown) is deposited on the second interlevel insulating film 12 by CVD, and patterned to form a second conductive layer 14. The second conductive layer 14 is formed on the first conductive layer 5 inside the opening 13a to cover the bottom and sidewall of the opening 13a. At the same time, part of the second conductive layer 14 extends onto the surface of the second interlevel insulating film 12 outside the opening 13a. The second conductive layer 14 formed in this fashion is in contact with the surface of the first conductive layer 5, and constitutes a floating gate electrode 20 together with the first conductive layer 5.

As the second conductive layer 14, another conductive material film such as an amorphous silicon film or titanium film may be used.

Figure 2H:
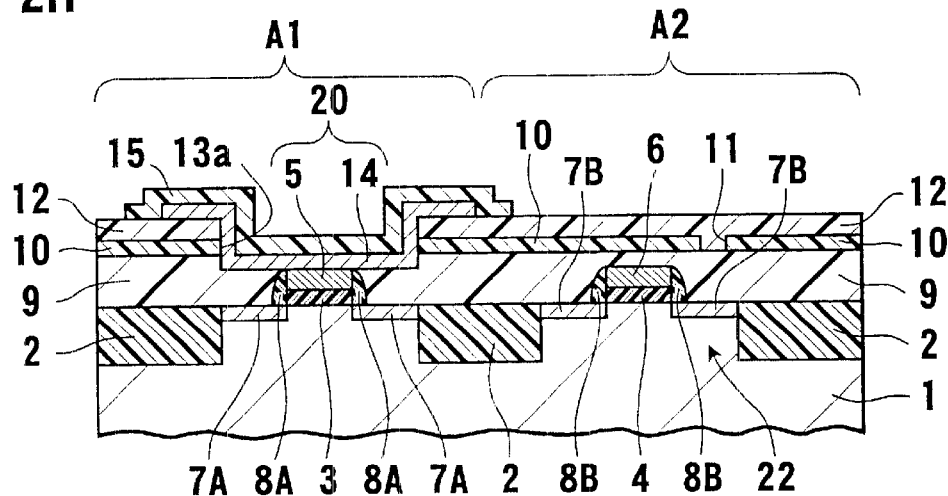

As shown in FIG. 2H, an insulating film (not shown), preferably a silicon oxide/silicon nitride multilayered film is formed on the second interlevel insulating film 12 by CVD. This film is patterned to form an internal insulating film 15 covering the second conductive layer 14.

The internal insulating film 15 is preferably made from a silicon oxide/silicon nitride multilayered film because this increases the permittivity of the internal insulating film 15 to further increase the electrostatic capacitance between the floating gate electrode 20 and the control gate electrode. As the internal insulating film 15, a silicon oxide/silicon nitride/silicon oxide/silicon nitride multilayered film is also preferable.

Note that the internal insulating film 15 functions as an inter-electrode insulating film between a control gate electrode 19 (to be described later) and the floating gate electrode 20.

Figure 2I:
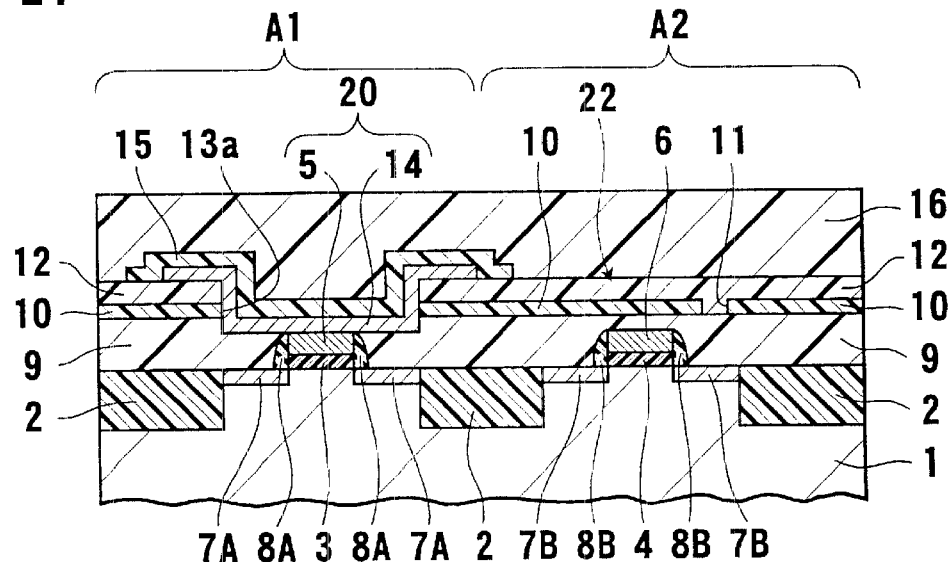

As shown in FIG. 2I, a third interlevel insulating film 16 is formed on the second interlevel insulating film 12. As the third interlevel insulating film 16, a BPSG film deposited by CVD can be used.

Figure 2J:
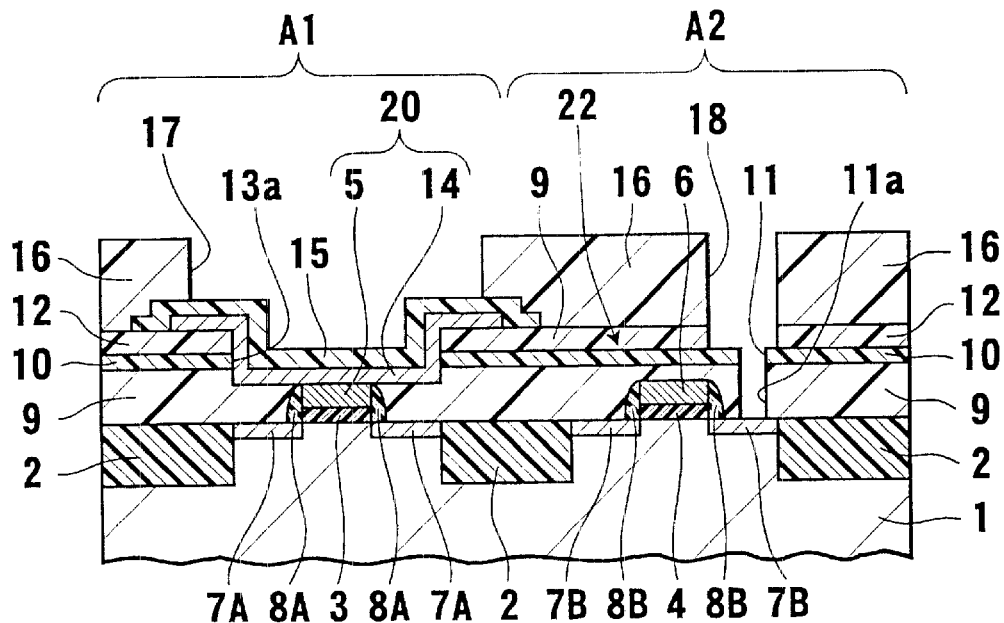

As shown in FIG. 2J, a patterned photoresist film (not shown) is formed on the third interlevel insulating film 16. The third interlevel insulating film 16 is selectively etched using the photoresist film as a mask, thereby forming an opening 17 for exposing the internal insulating film 15. Then, the photoresist film is removed. This etching step forms a trench 18 extending through the second and third interlevel insulating films 12 and 16, and a contact hole 11a extending through the first interlevel insulating film 9 at the same time as formation of the opening 17. That is, the third interlevel insulating film 16 is selectively etched using the photoresist film on the third interlevel insulating film 16 as a mask, and the second and first interlevel insulating films 12 and 9 are selectively etched. At this time, the first interlevel insulating film 9 is selectively etched via the through hole 11 owing to the difference in etching rate between the silicon nitride film 10 and the first interlevel insulating film 9. Thus, the contact hole 11a has the same sectional shape as that of the through hole 11. Consequently, a trench 18 having a sectional shape corresponding to the wiring pattern, and a contact hole 11a reaching the source/drain region 7B are simultaneously formed.

Figure 2K:
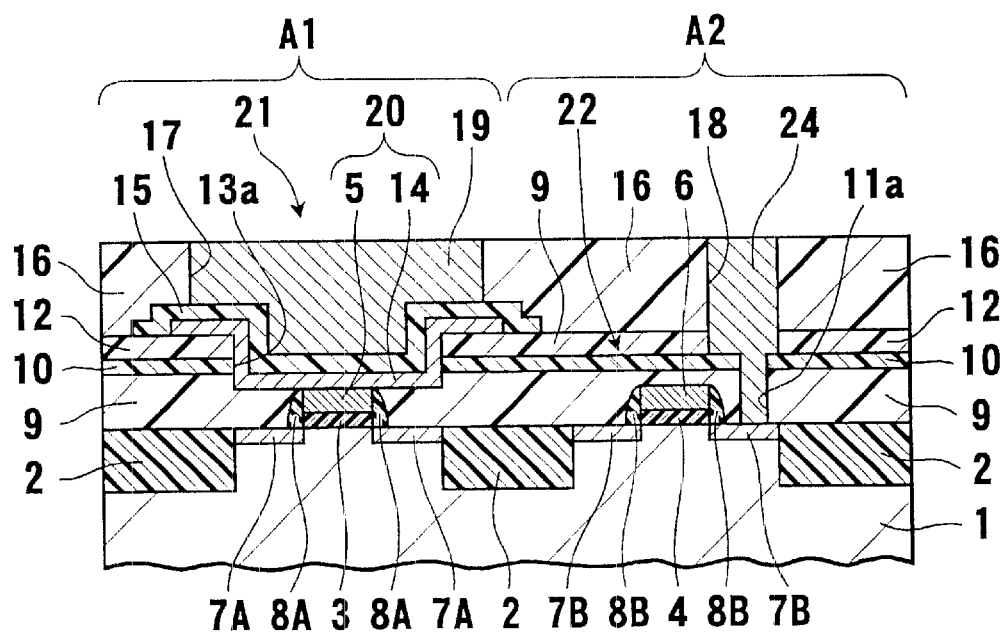
Figure 4:
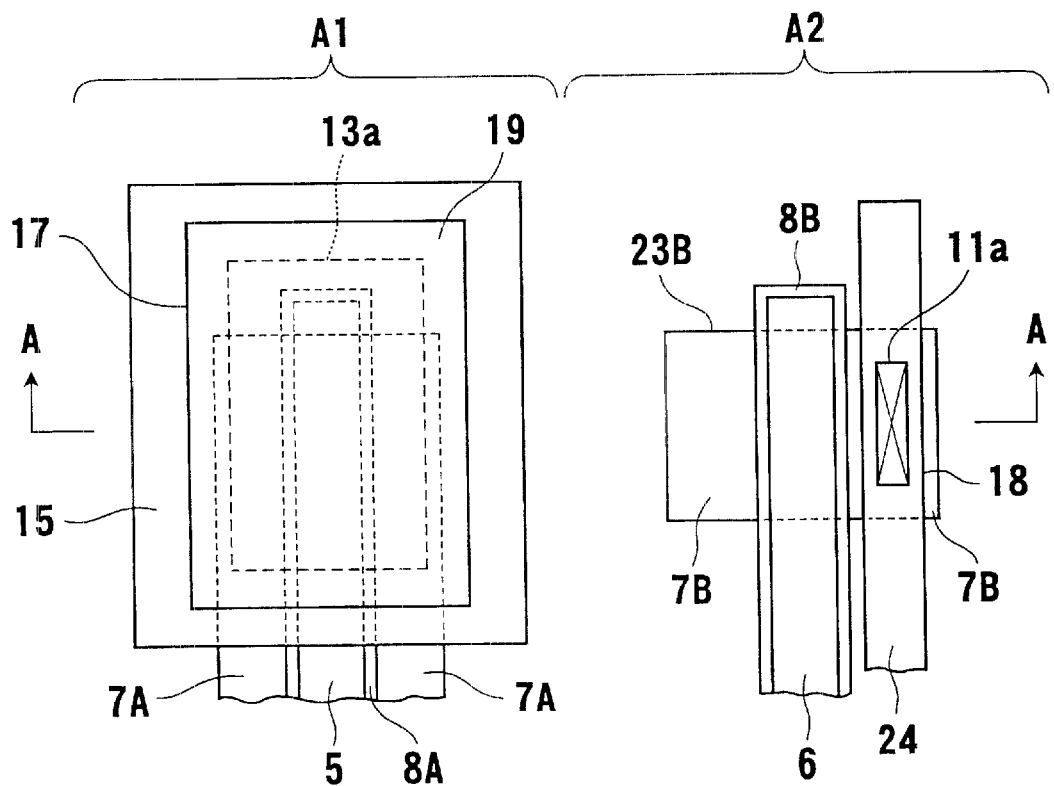
FIG. 4 is a schematic plan view in another principal step in manufacturing a semiconductor device according to the first embodiment of the present invention, and corresponds to a state in FIG. 2K.

As shown in FIGS. 2K and 4, a tungsten film (not shown) thick enough to fill the internal spaces of the opening 17, trench 18, and contact hole 11a is deposited on the third interlevel insulating film 16 by low-pressure CVD, and polished by CMP so as to expose the third interlevel insulating film 16. As a result, the tungsten film is selectively left in the opening 17, trench 18, and contact hole 11a. The tungsten film left in the opening 17 forms a control gate electrode 19, whereas the tungsten film left in the trench 18 forms an interconnection layer 24 of the MOS transistor 22. The bottom of the control gate electrode 19 is in contact with the surface of the internal insulating film 15. The interconnection layer 24 is electrically connected to a corresponding source/drain region 7B via the tungsten film remaining in the contact hole 11a.

In this manner, a memory cell 21 constituted by the floating gate electrode 20, internal insulating film 15, control gate electrode 19, pair of sidewall spacers 8A, and pair of source and drain regions 7A is formed in the memory cell region A1.

In the semiconductor device according to the first embodiment of the present invention manufactured by the above-described method, as is apparent from FIGS. 2K and 4, the floating gate electrode 20 of the memory cell 21 is comprised of the first conductive layer 5 formed on the silicon substrate 1 via the tunnel insulating film 3, and the second conductive layer 14 formed on the first conductive layer 5 inside the opening 13a of the first interlevel insulating film 9. The planar shape of the first conductive layer 5 is set to be patterned at the same time as the gate electrode 6 of the MOS transistor 22.

For this reason, the first conductive layer 5 and the gate electrode 6 can be simultaneously formed. In addition, the second conductive layer 14, internal insulating film 15, and control gate electrode 19 unique to the memory cell 21 can be formed after the first interlevel insulating film 9 covers the MOS transistor 22. The manufacturing process concerning formation of the MOS transistor 22 need hardly be changed. The manufacturing process and the manufacturing equipment can be easily shared, and sharing realizes low manufacturing cost.

The control gate electrode 19 and interconnection layer 24 made of the same material are simultaneously formed. Hence, the manufacturing process can be simplified to further reduce the manufacturing cost.

Since the second conductive layer 14 is formed within the opening 13a, the planar shape of the second conductive layer 14 can be widened without changing the occupied area of the memory cell 21. By widening the planar shape of the second conductive layer 14, the overlapping area between the floating and control gate electrodes 20 and 19 increases to increase the electrostatic capacitance between the floating and control gate electrodes 20 and 19. Thus, the capacitive coupling ratio increases to enable driving by low voltage.

Since the second conductive layer 14 extends onto the second interlevel insulating film 12 outside the through opening 13a together with the internal insulating film 15, the electrostatic capacitance between the floating and control gate electrodes 20 and 19 can be increased.

Second Embodiment

FIGS. 5A to 5E show the steps in manufacturing a semiconductor device according to the second embodiment of the present invention.

The semiconductor device according to the second embodiment of the present invention is the same as that in the first embodiment except that the second conductive layer and the internal insulating film have the same pattern shape and are simultaneously patterned. In FIGS. 5A to 5E, the same reference numerals as in the first embodiment denote the same parts, and a description thereof will be omitted.

The semiconductor device according to the second embodiment of the present invention is manufactured by the following method.

Figure 5A:
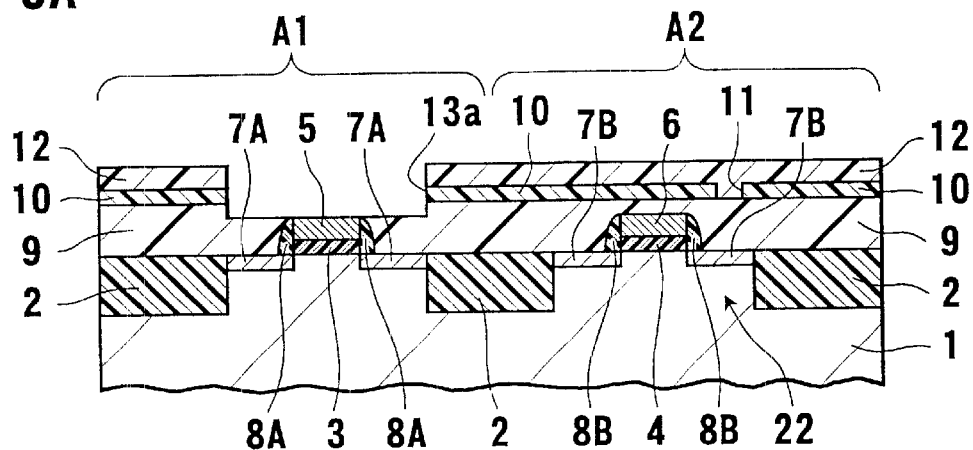
FIGS. 5A to 5E are schematic sectional views, respectively, showing the principal steps in manufacturing a semiconductor device according to the second embodiment of the present invention.

As shown in FIG. 5A, the same structure as shown in FIG. 2E is obtained similarly to the first embodiment of the present invention.

Figure 5B:
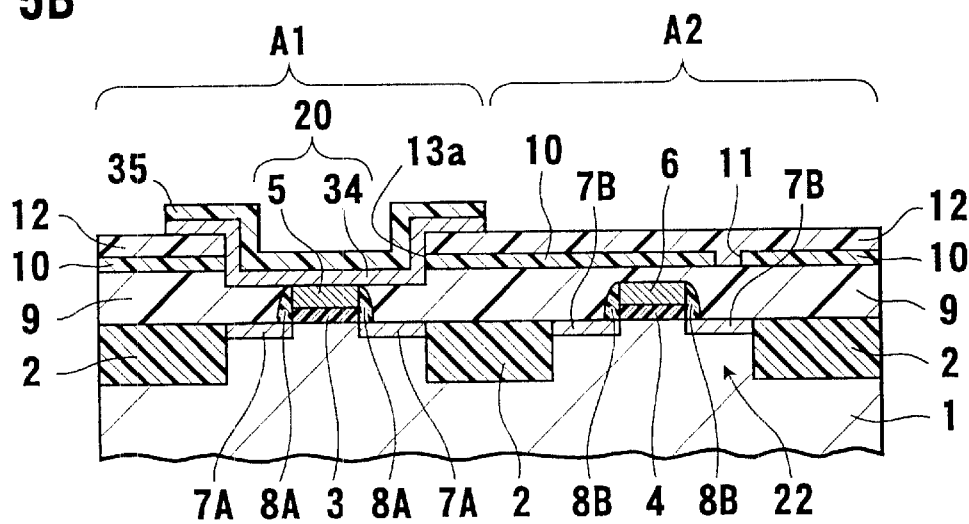

As shown in FIG. 5B, a doped polysilicon film (not shown) is deposited on a second interlevel insulating film 12 by CVD, and a silicon oxide/silicon nitride multilayered film (not shown) is formed on the polysilicon film. The polysilicon film and the silicon oxide/silicon nitride multilayered film are simultaneously patterned to form a second conductive layer 34 and an internal insulating film 35 which have the same pattern shape.

The second conductive layer 34 is formed on a first conductive layer 5 inside an opening 13a to cover the entire bottom and sidewall of the opening 13a. At the same time, part of the second conductive layer 34 extends onto the surface of the second interlevel insulating film 12 outside the opening 13a. The second conductive layer 34 formed in this fashion is in contact with the surface of the first conductive layer 5, and constitutes a floating gate electrode 20 together with the first conductive layer 5. The internal insulating film 35 covers the second conductive layer 34.

As the second conductive layer 34, another conductive material film such as an amorphous silicon film or titanium film may be used. As the internal insulating film 35, a silicon oxide/silicon nitride/silicon oxide/silicon nitride multilayered film is also preferable.

Figure 5C:
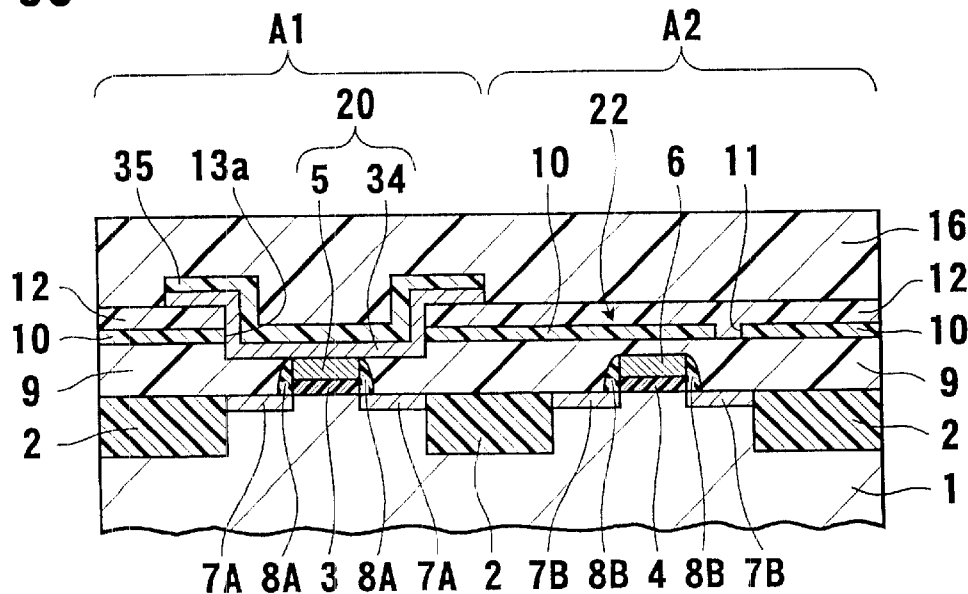

As shown in FIG. 5C, a third interlevel insulating film 16 is formed on the second interlevel insulating film 12. As the third interlevel insulating film 16, a BPSG film deposited by CVD is available.

Figure 5D:
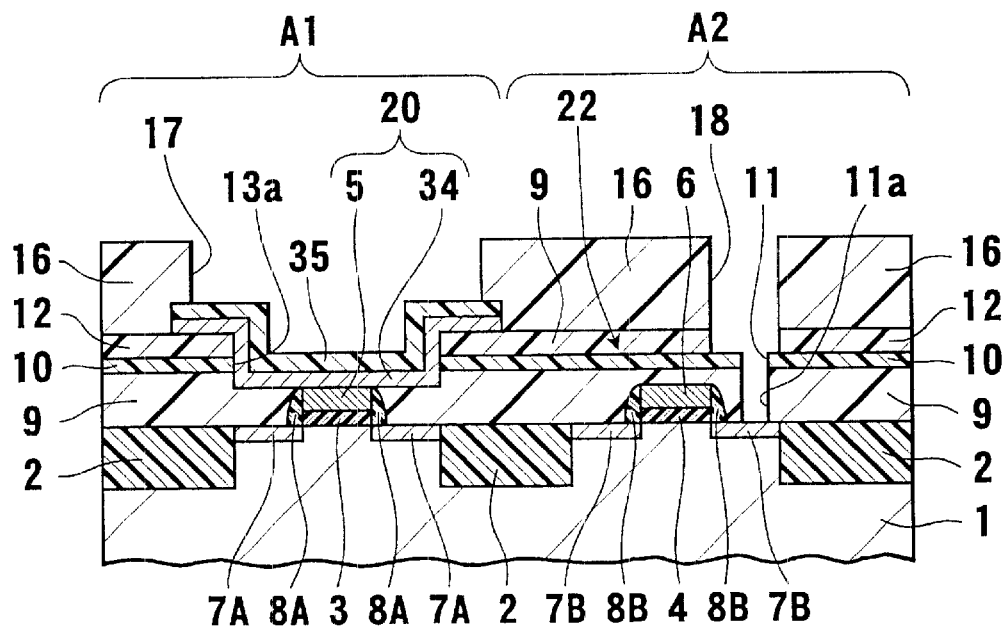

As shown in FIG. 5D, a patterned photoresist film (not shown) is formed on the third interlevel insulating film 16. The third interlevel insulating film 16 is selectively etched using the photoresist film as a mask, thereby forming an opening 17 for exposing the internal insulating film 35. Then, the photoresist film is removed. This etching step forms a trench 18 extending through the second and third interlevel insulating films 12 and 16, and a contact hole 11a extending through a first interlevel insulating film 9 at the same time as formation of the opening 17. That is, the third interlevel insulating film 16 is selectively etched using the photoresist film on the third interlevel insulating film 16 as a mask, and the second and first interlevel insulating films 12 and 9 are selectively etched. At this time, the first interlevel insulating film 9 is selectively etched via a through hole 11 owing to the difference in etching rate between the silicon nitride film 10 and the first interlevel insulating film 9. Thus, the contact hole 11a has the same sectional shape as that of the through hole 11. Consequently, a trench 18 having a sectional shape corresponding to the wiring pattern, and a contact hole 11a reaching a source/drain region 7B are simultaneously formed.

Figure 5E:
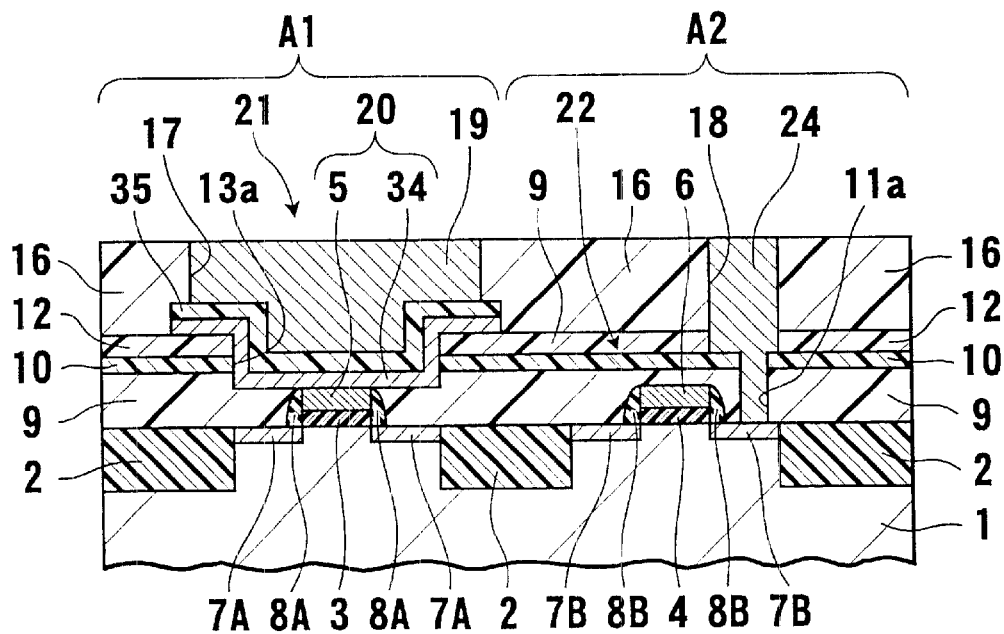

As shown in FIG. 5E, a tungsten film (not shown) thick enough to fill the internal spaces of the opening 17, trench 18, and contact hole 11a is deposited on the third interlevel insulating film 16 by low-pressure CVD, and polished by CMP so as to expose the third interlevel insulating film 16. As a result, the tungsten film selectively remains in the opening 17, trench 18, and contact hole 11a. The tungsten film left in the opening 17 forms a control gate electrode 19, whereas the tungsten film left in the trench 18 forms an interconnection layer 24 of a MOS transistor 22. The bottom of the control gate electrode 19 is in contact with the surface of the internal insulating film 35. The interconnection layer 24 is electrically connected to a corresponding source/drain region 7B via the tungsten film left in the contact hole 11a.

Accordingly, a memory cell 21 constituted by the floating gate electrode 20, the internal insulating film 35, the control gate electrode 19, a pair of sidewall spacers 8A, and a pair of source and drain regions 7A is formed in the memory cell region A1.

The semiconductor device according to the second embodiment of the present invention manufactured by the above-described method also attains the same effects as those of the first embodiment. The internal insulating film 35 has the same pattern shape as that of the second conductive layer 34, and the film 35 and the layer 34 are simultaneously patterned. As a result, the manufacturing process can be further simplified to reduce the manufacturing cost much more than the semiconductor device of the first embodiment.

In the first and second embodiments, the interconnection layer 24 is buried in the trench 18 formed in the third and second interlevel insulating films 16 and 12. However, the present invention is not limited to this. For example, the etching stopper film 10 and the second and third interlevel insulating films 12 and 16 may be omitted, and the patterned interconnection layer 24 may be directly formed on the first interlevel insulating film 9.

What is claimed:

1. A method of manufacturing a semiconductor device in which a nonvolatile memory cell with a floating gate electrode and a field effect transistor are formed on a semiconductor substrate, comprising:

(a) the first step of forming the field effect transistor, and a first conductive layer patterned into a predetermined shape via a tunnel insulating film on the semiconductor substrate;

(b) the second step of forming a first interlevel insulating film on the semiconductor substrate so as to cover the first conductive layer and the field effect transistor;

(c) the third step of selectively etching the first interlevel insulating film to form a first opening for exposing a surface of the first conductive layer, wherein a width of the first opening exceeds a width of the first conductive layer;

(d) the fourth step of forming a structure made up of a second conductive layer which is formed on the first conductive layer inside the first opening and patterned into a predetermined shape, and an internal insulating film which is formed on the second conductive layer and patterned into a predetermined shape; and (e) the fifth step of forming a control gate electrode of the nonvolatile memory cell on the internal insulating film, wherein the first and the second conductive layers constitute the floating gate electrode, and the first conductive layer has a planar shape which can be patterned at the same time as a gate electrode of the field effect transistor.

2. A method according to claim 1, wherein the internal insulating film and the second conductive layer are patterned into substantially the same shape.

3. A method according to claim 1, wherein the planar shape of the first conductive layer is substantially the same as a planar shape of the gate electrode.

4. A method according to claim 3, wherein the internal insulating film and the second conductive layer are patterned into substantially the same shape.

5. The method of claim 1, wherein the second conductive layer is in direct contact with an entirety of the width of the first conductive layer.

6. The method of claim the 5, wherein the second conductive layer extends beyond a width of the first conductive layer to a region directly above source and drain regions adjacent the first conductive layer.

7. A method according to claim 1, wherein the fifth step comprises forming, at the same time as the control gate electrode, an interconnection layer electrically connected to a source/drain region of the field effect transistor via a contact hole formed in the first interlevel insulating film.

8. A method according to claim 7, wherein the internal insulating film and the second conductive layer are patterned into substantially the same shape.

9. A method according to claim 7, wherein the second step further comprises forming on the first interlevel insulating film a second interlevel insulating film, the third step further comprises selectively etching the second interlevel insulating film to expose the surface of the first conductive layer, the fifth step further comprises forming a second opening for exposing a surface of the internal insulating film and a trench communicating with a contact hole overlying one of a source and drain region of an adjacent logic circuit region, burying the control gate electrode in the second opening, and burying an interconnection layer in the trench.

10. A method according to claim 9, wherein the internal insulating film and the second conductive layer are patterned into substantially the same shape.

11. A method according to claim 9, wherein the second conductive layer extends onto the second interlevel insulating film outside the first opening together with the internal insulating film.

12. A method according to claim 11, wherein the internal insulating film and the second conductive layer are patterned into substantially the same shape.

* * * * *